United States Patent
Arvidson et al.

(10) Patent No.: US 9,909,231 B2
(45) Date of Patent: Mar. 6, 2018

(54) FLOWABLE CHIPS AND METHODS FOR THE PREPARATION AND USE OF SAME, AND APPARATUS FOR USE IN THE METHODS

(71) Applicant: HEMLOCK SEMICONDUCTOR CORPORATION, Hemlock, MI (US)

(72) Inventors: Arvid Neil Arvidson, Sanford, MI (US); Terence Lee Horstman, Frankenmuth, MI (US); Michael John Molnar, Freeland, MI (US); Chris Tim Schmidt, Auburn, MI (US); Roger Dale Spencer, Jr., Midland, MI (US)

(73) Assignee: HEMLOCK SEMICONDUCTOR OPERATIONS LLC, Hemlock, MI (US)

( * ) Notice: Subject to any disclaimer, the term of this patent is extended or adjusted under 35 U.S.C. 154(b) by 153 days.

(21) Appl. No.: 14/559,331

(22) Filed: Dec. 3, 2014

(65) Prior Publication Data
US 2015/0090178 A1    Apr. 2, 2015

Related U.S. Application Data

(63) Continuation of application No. 13/196,934, filed on Aug. 3, 2011, now Pat. No. 8,926,749, which is a
(Continued)

(51) Int. Cl.
*C30B 15/02*    (2006.01)
*C30B 15/00*    (2006.01)
(Continued)

(52) U.S. Cl.
CPC .......... *C30B 15/002* (2013.01); *B07B 1/4654* (2013.01); *B07B 13/04* (2013.01);
(Continued)

(58) Field of Classification Search
USPC .............................. 117/13, 15, 17, 81, 82, 83
See application file for complete search history.

(56) References Cited

U.S. PATENT DOCUMENTS 3,898,051 A    8/1975    Schmid
4,525,336 A    6/1985    Griesshammer et al.
(Continued)

FOREIGN PATENT DOCUMENTS

JP    58099115    6/1983
JP    62260791    11/1987
(Continued)

OTHER PUBLICATIONS

Kolbsen, B.O., et al., Carbon in Silicon: Properties and Impact on Devices, Solid-State Electronics vol. 25, No. 8, pp. 759-775, 1982.
(Continued)

*Primary Examiner* — Robert M Kunemund
(74) *Attorney, Agent, or Firm* — Cantor Colburn LLP

(57) ABSTRACT

A method for recharging a crucible with polycrystalline silicon comprises adding flowable chips to a crucible used in a Czochralski-type process. Flowable chips are polycrystalline silicon particles made from polycrystalline silicon prepared by a chemical vapor deposition process, and flowable chips have a controlled particle size distribution, generally nonspherical morphology, low levels of bulk impurities, and low levels of surface impurities. Flowable chips can be added to the crucible using conventional feeder equipment, such as vibration feeder systems and canister feeder systems.

4 Claims, 5 Drawing Sheets

Related U.S. Application Data continuation of application No. 10/298,129, filed on Nov. 14, 2002, now Pat. No. 8,021,483.

(60) Provisional application No. 60/358,851, filed on Feb. 20, 2002.

(51) Int. Cl.
*C30B 29/06* (2006.01)
*C30B 11/00* (2006.01)
*C30B 15/04* (2006.01)
*B07B 1/46* (2006.01)
*B07B 13/04* (2006.01)

(52) U.S. Cl.
CPC .......... *C30B 11/001* (2013.01); *C30B 11/003* (2013.01); *C30B 15/02* (2013.01); *C30B 15/04* (2013.01); *C30B 29/06* (2013.01); *Y10T 117/1056* (2015.01)

(56) References Cited

U.S. PATENT DOCUMENTS

| 5,165,548 | A | 11/1992 | Dumler et al. |
| 6,375,011 | B1 | 4/2002 | Flottmann et al. |
| 6,835,247 | B2 | 12/2004 | Wood et al. |
| 2002/0108558 | A1 | 8/2002 | Hill et al. |
| 2003/0089302 | A1 | 5/2003 | Hartmann et al. |
| 2003/0101924 | A1 | 6/2003 | Holder et al. |

FOREIGN PATENT DOCUMENTS

| JP | 03271110 | 12/1991 |
| JP | 06100394 | 4/1994 |
| JP | 06144822 | 5/1994 |
| JP | 09142823 | 6/1997 |
| JP | 10015422 | 1/1998 |
| JP | 10029895 | 2/1998 |
| JP | 11169795 | 6/1999 |
| JP | 2000247623 | 9/2000 |
| JP | 2000302594 | 10/2000 |
| JP | 2001019594 | 1/2001 |
| JP | 2001206798 | 7/2001 |
| JP | 2002293688 | 10/2002 |
| WO | 199744277 | 11/1997 |

OTHER PUBLICATIONS

Lobreyer, T. et al., Polysilicon, Different Processes, Quality Requirements and Market, Silicon for the Chemical Industry IV, 1998, pp. 93-100.

Oya, Haruhiko et al., "Manufacturing Processes of Highly Purified Products", Handbook of High-Purification Technology, vol. 3 (without translation).

Oya, Haruhiko et al., "Manufacturing Processes of Highly Purified Products", Handbook of High-Purification Technology, vol. 3, (With translation attached).

Silicon—Crystal Growth and Wafer Process, 1994, VLSI Electronics, vol. 12, pp. 18-23, ISBN4-563-03605-6.

Standard specification for high purity polycrystalline silicon, Japan Electronics and Information Technology Industries Association. 2004.

Toshiyuki Takada, polysilicon materials, Electronic Materials and Parts, Nov. 1993, pp. 27-31.

Breneman, W.C. et al., A Comparison of the Trichlorosilane and Silane Routes in the Purification of Metallurgical Grade Silicon to Semiconductor Quality, Silicon for the Chemcial Industry IV, 1998, pp. 101-112.

Edited by UCS Semiconductor Key Technology and Research Association, Silicon Science, Realize Co., Ltd., Jun. 28, 1996, p. 19.

In re Pleuddemann, 910 F.2d 823 (Fed. Cir. 1990) ("Pleuddemann"). A copy of the decision.

FLOWABLE CHIPS AND METHODS FOR THE PREPARATION AND USE OF SAME, AND APPARATUS FOR USE IN THE METHODS

CROSS REFERENCE TO RELATED APPLICATIONS

This application is a Continuation of U.S. patent application Ser. No. 13/196,934 filed on Aug. 3, 2011 now U.S. Pat. No. 8,926,749, which claims benefit to U.S. patent application Ser. No. 10/298,129, which was filed on Nov. 14, 2002 now U.S. Pat. No. 8,021,483, which claims the benefit of U.S. Provisional Patent Application No. 60/358,851 filed Feb. 20, 2002 under 35 U.S.C. §119(e). U.S. application Ser. Nos. 13/196,934 and 10/298,129, and U.S. Provisional Patent Application No. 60/358,851, are hereby incorporated by reference. This application claims the benefit of U.S. patent application Ser. Nos. 13/196,934, 10/298,129 and U.S. Provisional Patent Application No. 60/358,851.

FIELD OF THE INVENTION

This invention relates to flowable chips and apparatus and methods for the preparation and use of flowable chips. The flowable chips are useful in a method for recharging a crucible in a Czochralski-type process.

BACKGROUND OF THE INVENTION

Most semiconductor chips used in electronic devices are fabricated from single crystal silicon prepared by a Czochralski-type (CZ) process. In the CZ process, a single crystal silicon ingot is produced by melting polycrystalline silicon source material in a crucible, stabilizing the crucible and source melt at an equilibrium temperature, dipping a seed crystal into the source melt, withdrawing the seed crystal as the source melt crystallizes on the seed to form a single crystal ingot, and pulling the ingot as it grows. Melting occurs at a temperature of 1420° C. in an inert gas environment at low pressure. The crucible is continually rotated about a generally vertical axis as the crystal grows. The rate at which the ingot is pulled from the source melt is selected to form an ingot having a desired diameter.

The polycrystalline silicon can be prepared using a fluidized bed reactor process to form granules. Alternatively, the polycrystalline silicon can be prepared using a chemical vapor deposition (CVD) process in a bell jar reactor. The polycrystalline silicon prepared by the CVD process can be broken or cut into suitably sized pieces such as rods, chunks, chips, and combinations thereof, before loading into the crucible. The polycrystalline silicon is melted to form the molten silicon.

One of the drawbacks of the CZ process is that when the charge of polycrystalline silicon is melted, the crucible may be only half full of molten silicon. This is due to the interstitial spaces left in the crucible charged with irregularly shaped pieces and results in inefficient utilization of the crystal puller. Therefore there is a need to develop methods to efficiently top up a charge after it is melted and before the start of the crystal seeding.

A further drawback of the CZ process is that the crucible can generally be used for only one pull before it must be replaced because crucibles degrade with use and can introduce impurities into the molten silicon. New crucibles are expensive to obtain, and used crucibles are expensive to dispose of. This has led to development of improved crucibles capable of lasting through multiple ingot pulls while contributing reduced contamination to the molten silicon. Therefore, a need exists for efficiently recharging the crucible during or after pulling the first ingot and any subsequent ingots. Various methods for topping up melts and recharging the crucible have been proposed.

In one method, granular polycrystalline silicon made by a fluidized bed process (such as granular material made by Ethyl Corporation or MEMC) has been loaded into the molten heel remaining in the crucible after the ingot has been pulled or to top up the initial charge melt. However, this method suffers from the drawback that granular polycrystalline silicon made by the fluidized bed process contains entrapped hydrogen. When the granular polycrystalline silicon is added to the heel, the hydrogen is released, causing the granules to burst. This causes splashing of molten silicon, which can damage the crucible.

In another method, granular polycrystalline silicon is added to the crucible while the ingot is being pulled. However, this method suffers from the drawback that due to its small particle size, granular polycrystalline silicon is difficult to melt in sufficient time to achieve a reasonable addition rate. Additional heat is required to melt these small particles, leading to added cost and accelerated crucible degradation. Accelerated crucible degradation can shorten crucible life and increase cost. If the granular polycrystalline silicon addition rate is too fast and the granules do not melt sufficiently, this can damage the surface of the ingot being pulled and cause dislocations and damage singularity of the crystal. Furthermore, granular polycrystalline silicon may have high amounts of dust. Dust can create contamination problems in the puller housing and can move to the surface of the pulled ingot and cause dislocations and reduce crystal yields. This may also increase process time, due to the need to remelt and repull the ingot.

Overall, granular polycrystalline silicon has inadequate purity for some applications, regardless of the process used to recharge the granules.

Previous attempts to use polycrystalline silicon rods prepared by a chemical vapor deposition process and broken into pieces have also not been used for crucible recharge due to purity or size problems. If relatively large size polycrystalline silicon pieces are used for crucible recharge, the process may suffer from the drawbacks of damage to the crucible and damage to the recharge apparatus. If the polycrystalline silicon pieces are broken into smaller sizes, contamination with impurities has made the polycrystalline silicon pieces unsuitable for use in crucible recharge processes.

SUMMARY OF THE INVENTION

This invention relates to flowable chips and apparatus and methods for the preparation and use of flowable chips. Flowable chips may be prepared by a method comprising:
a) comminuting polycrystalline silicon rods,
b) sorting the product of step a) to obtain a controlled particle size distribution, and
c) removing impurities from the product of step a) or step b), or both. Step a) may be carried out using a jaw crusher. Step b) may be carried out using a step deck classifier. Step b) may further include air classification for removal of dust. Step c) may include exposing the product of step a) or step b), or both, to a magnetic field. Step c) may include surface cleaning the product of step b).

This invention further relates to methods for recharging a crucible in a Czochralski-type process using the flowable chips. The method comprises:

a) pulling a silicon ingot from a crucible in a Czochralski-type process;
b) adding flowable chips to molten silicon in the crucible, where flowable chips comprise polycrystalline silicon particles prepared by a chemical vapor deposition process and have a controlled particle size distribution, generally nonspherical morphology, low levels of bulk impurities, and low levels of surface impurities; and
c) optionally adding a dopant to the crucible.

This invention further relates to a method comprising;

a) pulling a silicon ingot from a crucible in a Czochralski-type process and leaving a heel in the crucible;
b) solidifying at least a surface of the heel;
c) adding flowable chips to the surface of the heel, where flowable chips comprise polycrystalline silicon particles prepared by a chemical vapor deposition process and have a controlled particle size distribution of 1 to 12 mm, generally nonspherical morphology, low levels of bulk impurities, and low levels of surface impurities; and
d) optionally adding a dopant to the crucible.

DETAILED DESCRIPTION OF THE INVENTION

Figure 1:
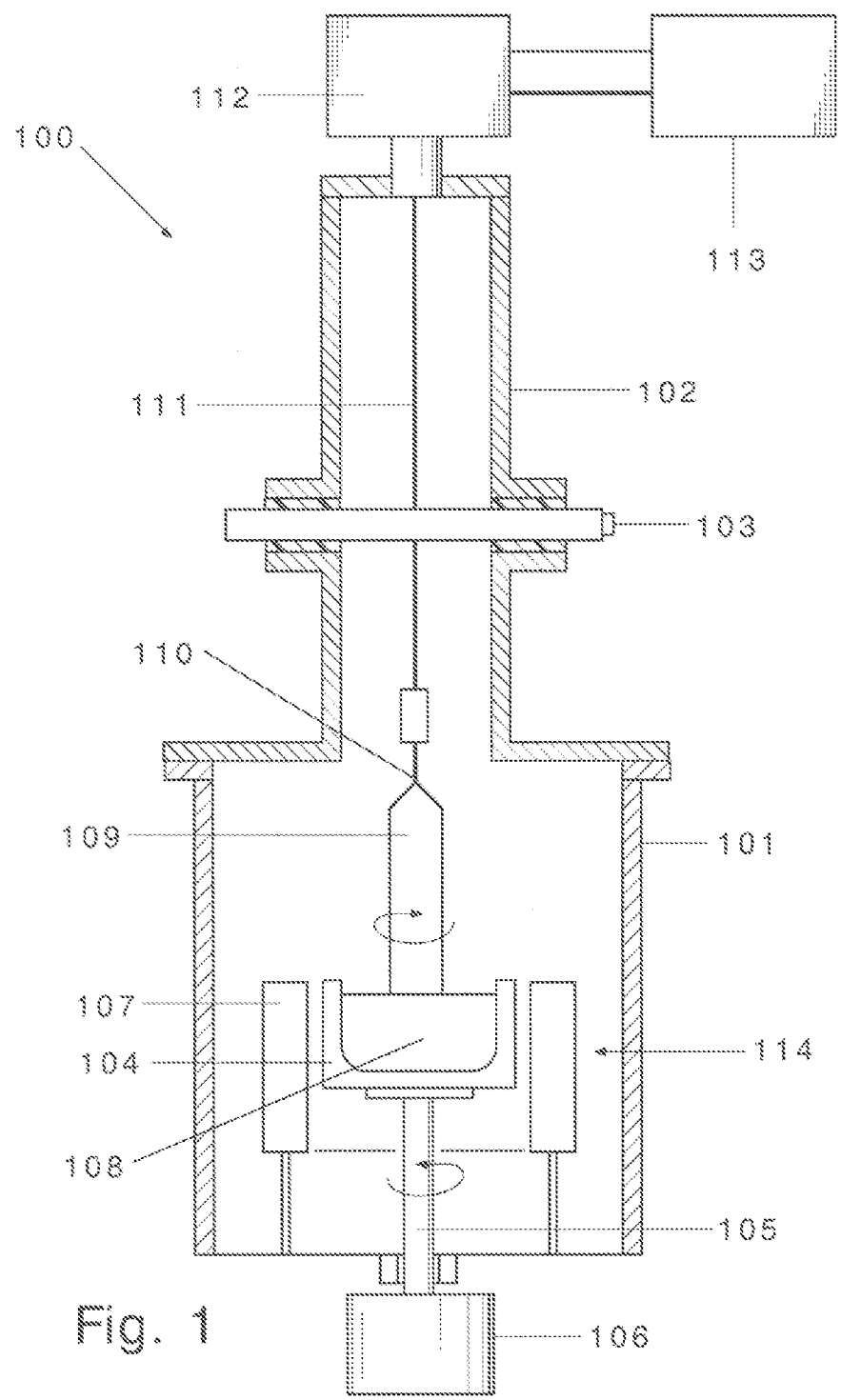
FIG. 1 is a schematic representation of a CZ process apparatus.

All amounts, ratios, and percentages are by weight unless otherwise indicated. The following is a list of definitions, as used herein.

Definitions

"A" and "an" each mean one or more.

"Blinding" means that a gap between two decks in a step deck classifier becomes plugged, preventing polycrystalline silicon pieces from passing through the gap, thus rendering the step deck classifier ineffective as a sorting means.

"Charge maximization" means a process in which a vessel, such as a mold or crucible, is filled with polycrystalline silicon having varying sizes and shapes in a manner to increase the amount of the melt over the amount obtained by filling the vessel randomly.

"Charge top up" means a process in which a vessel, such as a mold or crucible, is filled with polycrystalline silicon, said polycrystalline silicon is melted, and thereafter additional polycrystalline silicon is added to increase the amount of the melt.

"Chemical vapor deposition" means any chemical vapor deposition process that does not include fluidized bed reactor processes for preparing polycrystalline silicon. Chemical vapor deposition is exemplified by a Siemens type process.

"Comminute" means to break up, chop, or grind into small particles". Comminute includes any method for reducing polycrystalline rods into pieces, including but not limited to cutting the rods and then further breaking them by various methods.

"Controlled particle size distribution" means that at least 75% of the particles in a group of particles have particle size in a specified range. For example, controlled particle size distribution of 4 to 12 millimeters (mm) means that at least 75% of the particles have particle size in the range of 4 to 12 mm and up to 25% of the particles have a particle size outside the range of 4 to 12 mm "Donor" means any atom that contributes an electron to silicon. Donors include antimony, arsenic, and phosphorous.

"Flowable" means the capability to deliver multiple solid particles through a transfer system without bridging, including when vibration energy is added to the system to help prevent the formation of a bridged particle network.

"Flowable chips" means polycrystalline silicon particles having a controlled particle size distribution, generally nonspherical morphology, low levels of bulk impurities, and low levels of surface impurities.

"Granular" and "granule" each mean a polycrystalline silicon particle prepared by a fluidized bed process and having a particle size of 6 millimeters or less. Granules are usually spherical or approximately spherical.

"Heel" means a quantity of silicon left in a vessel. Heel includes the quantity of silicon left in a crucible after an ingot has been pulled out of the crucible and the quantity of molten silicon resulting from melting a charge in the vessel prior to charge top up.

"Particle size" means the longest straight line between two points on a particle. For example, for spherical particles, particle size is the diameter.

The abbreviation "ppba" means parts per billion atomic relative to silicon.

The abbreviation "ppma" means parts per million atomic relative to silicon.

Flowable Chips

Flowable chips are polycrystalline silicon particles having a controlled particle size distribution. The controlled particle size distribution can be 0.2 to 45 mm, alternatively 1 to 25 mm, alternatively 1 to 20 mm, alternatively 3 to 20 mm, alternatively 4 to 12 mm, alternatively 4 to 10 mm, alternatively 1 to 12 mm, alternatively 1 to 8 mm. However, the exact controlled particle size distribution will be selected based on various factors including the method in which the flowable chips will be used and the apparatus used to feed them. For example, flowable chips that will be used in a CZ process, or in electronic grade applications, or both, may have a controlled particle size distribution of 2 to 45 mm. Alternatively, flowable chips that will be used in a solar grade application, such as a casting process, can have a controlled particle size distribution of 0.2 to 45 mm For some applications, controlled particle size distribution can be 4 to 12 mm, alternatively 4 to 8 mm, alternatively 4 to 6 mm Without wishing to be bound by theory, it is thought that a controlled particle size distribution toward the lower end of the 4 to 12 mm range will minimize splashing when the flowable chips will be added to a crucible containing molten silicon. For some applications, controlled particle size distribution can be 9 to 12 mm, alternatively 10 to 12 mm Without wishing to be bound by theory, it is thought that a controlled particle size distribution toward the higher end of the 4 to 12 mm range may improve ease of melting when the flowable chips will be added to a crucible containing a heel that is at least partially solidified.

The disclosure of ranges herein should be taken not only to disclose the range itself but also anything subsumed therein, as well as endpoints. For example, disclosure of a range of 4 to 12 includes not only the range of 4 to 12, but also 4, 5.7, 11 and 12 individually, as well as any other number subsumed in the range. Furthermore, disclosure of a range of, for example, 4 to 12 includes the subranges of 4 to 8, 9 to 10, 9 to 12, and 10 to 12, as well as any other subrange subsumed in the range and any ranges that constitute equivalents of the ranges disclosed herein.

The morphology of flowable chips is generally nonspherical. Exact morphology depends on the method used to make the flowable chips. For example, when the flowable chips are prepared by the methods disclosed herein, e.g., manually breaking polycrystalline silicon rods by striking with a low-contamination impact tool such as that disclosed in EP 0 539 097 A1, etc., the morphology will be irregular.

Flowable chips have low levels of bulk impurities, such as boron, donor, phosphorous, carbon, and total metals. The level of bulk impurities can be less than or equal to 0.2 ppma, alternatively less than or equal to 0.03 ppma, alternatively less than or equal to 0.025 ppma. The level of boron can be less than or equal to 0.06 ppba. However, for some applications, such as where boron will be used as a dopant, the level of boron can be less than or equal to 20 ppba, alternatively 5 to 20 ppba.

The level of donor is less than or equal to 0.30 ppba. Flowable chips can have a bulk level of phosphorous of less than or equal to 0.02 ppba, alternatively less than or equal to 0.015 ppba. The level of carbon is less than or equal to 0.17 ppma. The total level of bulk metal impurities is less than or equal to 4.5 ppba, alternatively less than or equal to 1 ppba. Bulk metal impurities include Cr, Cu, Fe, and Ni. Flowable chips can have a bulk level of Cr of less than or equal to 0.01 ppba. Flowable chips can have a bulk level of Cu of less than or equal to 0.01 ppba. Flowable chips can have a bulk level of Fe of less than or equal to 0.01 ppba. Flowable chips can have a bulk level of Ni of less than or equal to 0.01 ppba.

Bulk impurity levels can be measured by methods known in the art, such as the float zoning methods disclosed in U.S. Pat. Nos. 4,912,528; 5,361,128; and 5,436,164, and the method described herein in Example 3.

Flowable chips have low levels of total surface impurities. The total level of surface impurities is less than or equal to 30 ppba, alternatively 15 ppba, alternatively 4.5 ppba. Surface impurities include Co, Cr, Cu, Fe, Na, Ni, W, and Zn.

Figure 4:
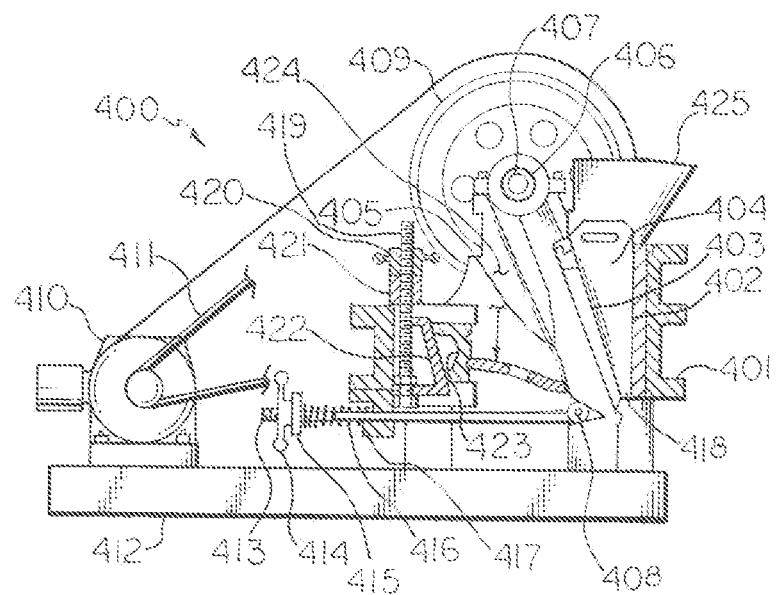
FIG. 4 is a side sectioned view of a jaw crusher for use in the method of preparing flowable chips.

When flowable chips are prepared using the method described below using a jaw crusher such as that in FIG. 4 and a step deck classifier such as that in FIGS. 5-8, flowable chips can have further reduced amounts of surface impurities. For example, flowable chips can have amounts of Cr less than or equal to 0.06 ppba, alternatively less than or equal to 0.02 ppba, alternatively less than or equal to 0.01 ppba, alternatively less than or equal to 0.004 ppba. Flowable chips can have surface amounts of Cu less than or equal to 0.15 ppba, alternatively less than or equal to 0.03 ppba, alternatively less than or equal to 0.02 ppba, alternatively less than or equal to 0.01 ppba. Flowable chips can have surface amounts of Fe less than or equal to 18 ppba, alternatively less than or equal to 10 ppba, alternatively less than or equal to 9 ppba, alternatively less than or equal to 7 ppba. Flowable chips can have surface amounts of Na less than or equal to 0.9 ppba, alternatively less than or equal to 0.8 ppba, alternatively less than or equal to 0.5 ppba, alternatively less than or equal to 0.4 ppba. Flowable chips can have surface amounts of Ni less than or equal to 0.1 ppba, alternatively less than or equal to 0.07 ppba, alternatively less than or equal to 0.04 ppba, alternatively 0 ppba. Flowable chips can have surface amounts of Zn less than or equal to 0.6 ppba, alternatively less than or equal to 0.5 ppba, alternatively less than or equal to 0.4 ppba, alternatively less than or equal to 0.3 ppba.

Surface purity can be measured by methods known in the art, such as the methods disclosed in U.S. Pat. No. 5,851,303.

Flowable chips also can have low levels of dust. Without wishing to be bound by theory, it is thought that low levels of dust facilitates melting and reduces crystal dislocation rates when the flowable chips are added to a crucible.

Flowable chips can have low residual gas content. Flowable chips can contain no hydrogen or lower levels of hydrogen than granules prepared by fluidized bed processes. Flowable chips can have a hydrogen content of 0 to 3600 ppba, alternatively 0 to 1300 ppba, alternatively 0 to 800 ppba, alternatively 800 to 1300 ppba. Flowable chips can contain low levels of chlorine. Flowable chips can have a chlorine content of 0 to 300 ppba, alternatively 20 to 120 ppba, alternatively 25 to 110 ppba, alternatively 30 to 100 ppba, alternatively 50 to 65 ppba.

Method of Preparing Flowable Chips

Flowable chips can be prepared by a method comprising:
a) breaking or cutting polycrystalline silicon rods,
b) sorting the product of step a) to obtain a controlled particle size distribution, and optionally c) surface cleaning the product of step a) or step b), or both.

A flowable chip product can be prepared by the method described above, further comprising:
d) packaging the product of steps a), b), or c).

Alternatively, flowable chips may be prepared by a method comprising:
a) comminuting polycrystalline silicon rods,
b) sorting the product of step a) to obtain a controlled particle size distribution, and
c) removing impurities from the product of step a) or step b), or both.

A flowable chip product can be prepared by the method described above, further comprising:
d) packaging the product of steps a), b), or c).

Preparing Polycrystalline Silicon

Polycrystalline silicon rods can be prepared by methods known in the art. For example, polycrystalline silicon rods can be prepared by a chemical vapor deposition process comprising chemical vapor deposition of a high purity chlorosilane or silane gas onto a heated substrate, see *Handbook of Semiconductor Silicon Technology*, edited by William C. O'Mara, Robert B. Herring, and Lee P. Hunt, Noyes Publications, Park Ridge, N.J., U.S.A., 1990, Ch. 2, pp. 39-58.

Comminuting Polycrystalline Silicon

The polycrystalline silicon rods can be comminuted, for example, by cutting with a saw or by striking with a low-contamination impact tool such as that disclosed in EP 0 539 097 A1. Alternatively, the polycrystalline silicon rods may be comminuted using a jaw crusher. Alternatively, the polycrystalline silicon rods may be comminuted by striking with a low-contamination impact tool and the resulting comminuted rods may be further comminuted using a jaw crusher. Alternatively, the polycrystalline silicon rods may be comminuted by cutting with a saw, and thereafter striking with a low-contamination impact tool, and thereafter further comminuted using a jaw crusher. An example of a suitable jaw crusher is shown in FIG. 4. The jaw crusher 400 comprises a frame assembly 401 having a stationary jaw plate 402 mounted thereto. A movable jaw plate 403 faces the stationary jaw plate 402. A jaw cavity 404 forms between the jaw plates 402, 403. Polycrystalline silicon can be fed from the hopper 425 into the jaw cavity 404.

The movable jaw plate 403 is mounted to a Pitman carrier assembly 405. The Pitman carrier assembly 405 is connected to a Pitman bearing 406, which surrounds an eccentric shaft 407 at one end, and a tension rod pin 408 at the opposite end. The eccentric shaft 407 is mounted to a flywheel 409. The motor 410 drives a belt 411 around flywheel 409. Flywheel 409 turns eccentric shaft 407 to move movable jaw plate 403 in an elliptical motion with respect to stationary jaw plate 402. The rotational speed may be 300 to 400 revolutions per minute (r.p.m.). The motor 410 is mounted to base 412. The motion of the movable jaw plate 403 crushes the polycrystalline silicon in jaw cavity 404. Particle size of the resulting polycrystalline silicon pieces is reduced sufficiently for the polycrystalline silicon pieces to exit jaw cavity 404 through discharge slot 418.

A horizontal spring assembly includes tension rod 413 running through adjusting wheel 414, outside spring collar 415, tension spring 416, and inside spring collar 417 to tension rod pin 408. Adjusting wheel 414 mounted to outside spring collar 415 can be turned to adjust tension spring 416. The horizontal spring assembly can be used to hold the Pitman 405 in contact with the toggle plate 424.

A vertical assembly includes wedge adjusting rod 419 running through an adjusting wheel 420 and cross bar 421. Adjusting wedge 422 is mounted to bearing wedge 423. Toggle plate bearing wedge 423 is mounted to toggle plate 424. Toggle plate 424 is mounted to Pitman carrier assembly 405 above tension rod pin 408. The vertical assembly can be used to adjust the width of the discharge slot 418. The position of the toggle plate 424 (in grooves of bearing wedge 423) determines the movement of the Pitman 405 and the motion of the bottom of movable jaw plate 403.

Polycrystalline silicon can be fed to the jaw crusher 400 from hopper 425. As the polycrystalline silicon travels through the jaw crusher 400, the movable jaw plate 403 causes the polycrystalline silicon to break into smaller polycrystalline silicon pieces. The polycrystalline silicon pieces can vary in size from dust to nuggets to shards to flakes to oversize chunks. The size distribution of the polycrystalline silicon pieces will depend on various factors including the width of the discharge slot 418 and the residence time in the crushing cavity 404.

The jaw plates 402, 403 comprise materials that minimize contamination of silicon, such as materials possessing a hardness greater than or comparable to polycrystalline silicon. The jaw plates may comprise tungsten carbide, tungsten carbide with a cobalt binder, tungsten carbide with a nickel binder, $Cr_2C_3$, $Cr_2C_3$ with NiCr binder, or combinations thereof. Use of tungsten carbide containing materials may reduce the level of iron contaminants imparted to silicon by the comminuting operation. The hopper 425 for supplying the polycrystalline silicon rods or oversize polycrystalline silicon pieces, or both and a discharge chute (not shown) from the jaw crusher 400 can be made of, or lined with, the same materials of construction as the jaw plates 402, 403 or any other material of construction that minimize contamination of silicon. Such materials of construction include ultra high molecular weight polyethylene (UHMWPE), polypropylene, perfluoroalkoxy resin (PFA), polyurethane (PU), polyvinylidene difluoride (PVDF), TEFLON®, tungsten carbide, silicon, and ceramic One skilled in the art would recognize that multiple jaw crushers may be used in series to obtain a desired shape distribution or the size distribution described above, or both, or to recycle oversize polycrystalline silicon pieces, or both. One skilled in the art would recognize that conventional comminution apparatus, such as the jaw crushers, gyratory crushers, crushing roll machines, cone crushers, and table mills, disclosed in *Introduction to Particle Technology*, Ch. 10, "Particle Size Reduction", John Wiley & Sons, Inc., New York, N.Y., April, 1999, pp. 241-263, can be used in this invention provided that the materials of construction of the parts of the comminution apparatus that contact the silicon comprise materials that minimize contamination of silicon. Suitable jaw crushers are commercially available from Morse Jaw Crushers from Metso Minerals Industries, Inc., of Danville, Pa., U.S.A.

One skilled in the art would recognize that alternative comminution apparatus may be used in addition to, or instead of, the jaw crusher in the methods of this invention. Suitable comminution apparatus are disclosed in U.S. Pat. Nos. 4,815,667; 5,346,141; and 5,464,159; EP 0 573 855; JP 02565759; and JP 58145611.

Sorting the Polycrystalline Silicon Pieces

The polycrystalline silicon pieces (broken rods) can be sorted manually or by use of an apparatus, such as the rotary silicon screen disclosed in U.S. Pat. No. 5,165,548 or the sorting apparatus disclosed in U.S. Pat. No. 3,905,556; 5,064,076; or 5,791,493 provided that the portions of the sorting apparatus that contact silicon comprise materials of construction that minimize contamination of silicon, such as those discussed above.

Alternatively, the polycrystalline silicon pieces may be sorted using an apparatus including a step deck classifier. The apparatus for sorting polycrystalline silicon pieces comprises I) a vibratory motor assembly, and
II) a step deck classifier mounted to the vibratory motor assembly.

The step deck classifier comprises
i) a first deck comprising
a) an inlet for polycrystalline silicon pieces to a grooved region,
b) the grooved region beginning at or downstream from the inlet, where
each groove comprises crests and troughs, and
c) an outlet end downstream of the inlet, where
the outlet end of the first deck is angled such that the crests of the grooves extend out further over a first gap between the first deck and a final deck than the troughs of the grooves, and
ii) the final deck positioned downstream of the first gap and below the first deck, the final deck comprising
a) an inlet for polycrystalline silicon pieces,
b) a grooved region beginning at or downstream from the inlet, where each groove comprises crests and troughs, and c) an outlet for polycrystalline silicon pieces, iii) a collection container under the first gap for collection polycrystalline pieces that fall through the first gap, and iv) a collection container for oversize polycrystalline silicon pieces under the outlet of the final deck for collecting oversize polycrystalline silicon pieces that do not fall through the first gap.

The step deck classifier may further comprise one or more additional decks between the first deck and the final deck, where each additional deck comprises a) an inlet for polycrystalline silicon pieces, b) a grooved region beginning at or downstream from the inlet, where each groove comprises crests and troughs, and c) an outlet end of the additional deck, where the outlet end of the additional deck is angled such that the crests of the grooves extend out further over a gap at the outlet end than the troughs of the grooves.

The apparatus for sorting polycrystalline silicon pieces may further comprise a weigh scale under iii) the collection container or a dust removing system located upstream of the first gap, or both, or any other modification available to one of ordinary skill in the art without undue experimentation. One skilled in the art would recognize that more than one step deck classifier can be used in series to sort the polycrystalline silicon pieces.

Figure 5:
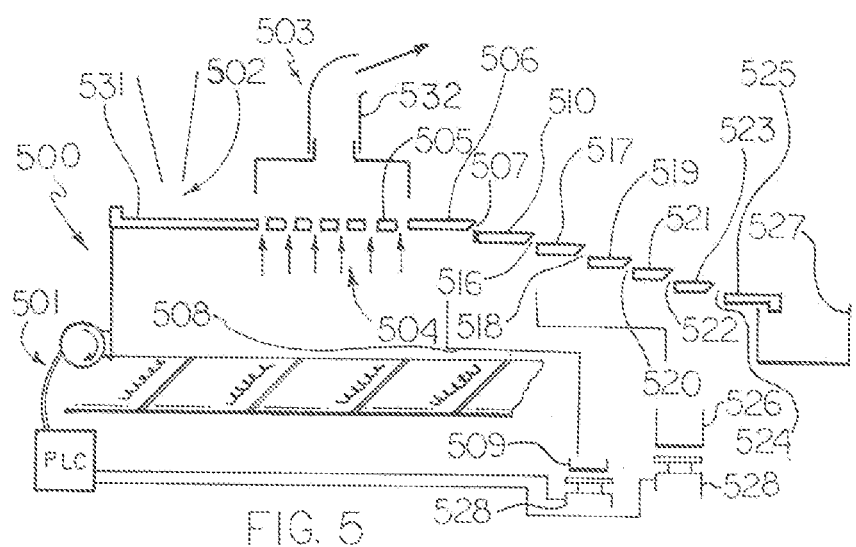
FIG. 5 is a side view of a step deck classifier for use in the method of preparing flowable chips.

An example of an apparatus for sorting polycrystalline silicon pieces and including a step deck classifier is shown in FIGS. 5-8. FIG. 5 shows a side view of the apparatus. The step deck classifier 500 is mounted to a vibratory motor assembly 501. The step deck classifier 500 has an inlet 502 for polycrystalline silicon pieces. The vibratory motor assembly 501 causes the polycrystalline silicon pieces to move across a first deck 531. The polycrystalline silicon pieces first pass through a fluid bed region 503 where dust is removed by air flow represented by arrows 504 through a perforated plate 505 to a dust collector 532. The polycrystalline silicon pieces move past the fluid bed region 503 and into a grooved region 506. The polycrystalline silicon pieces settle into the troughs 520 of the grooves 512 (shown in FIGS. 6-8) or remain on top of the crests 519 of the grooves 512, depending on size and shape. As the polycrystalline silicon pieces reach the end of the first deck 531, polycrystalline silicon pieces smaller than the gap 507 fall through the gap 507 and onto the conveyor 508. The polycrystalline silicon pieces that fall are conveyed to the collection container for small size polycrystalline silicon pieces 509. Larger polycrystalline silicon pieces pass over the gap 507 and fall onto the second deck 510.

Figure 7:
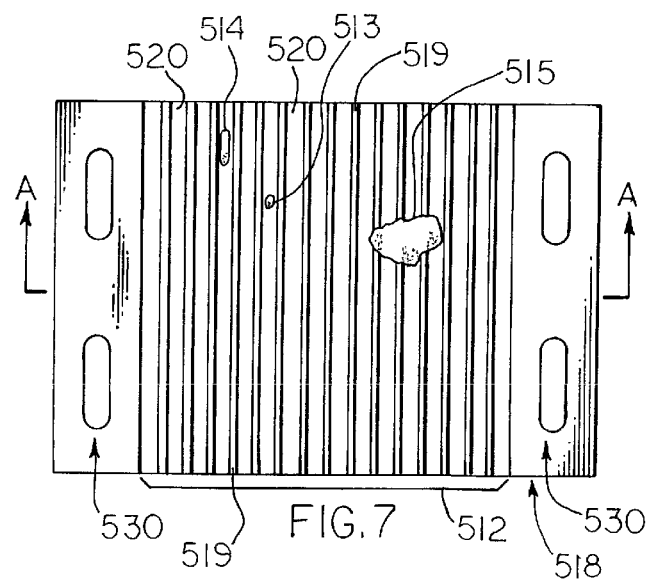
FIG. 7 is a top view of the second deck of the step deck classifier in FIG. 5.
Figure 8:
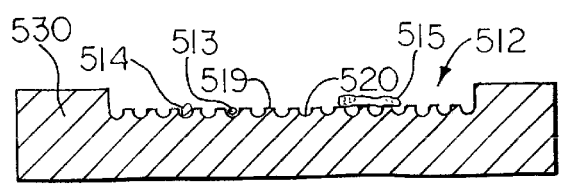
FIG. 8 is a cross sectional view of the second deck of the step deck classifier in FIG. 5.

FIG. 7 shows a top view of the second deck 510, and FIG. 8 shows a cross sectional view of the second deck 510 taken across line A-A. The top of the second deck 510 has a plurality of grooves 512. Each groove 512 has a crest 519 and a trough 520. The grooves 512 are rounded. Sidewalls 530 extend above the crests 519 to prevent polycrystalline silicon pieces from falling off the side of the second deck 510. The polycrystalline silicon pieces travel from the inlet end 511 of the second deck 510 to the outlet end 518 of the second deck 510.

Figure 6:
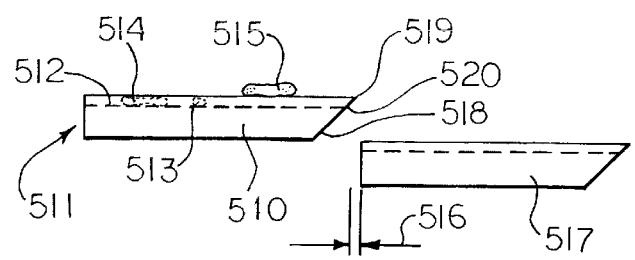
FIG. 6 is an enlarged side sectioned view of the second and third decks of the step deck classifier in FIG. 5.

FIG. 6 shows a side sectioned view of the second deck 510, the third deck 517, and the gap 516 therebetween. The inlet end 511 of the second deck 510 is perpendicular to horizontal. Grooves 512 are cut into the top of the second deck 510. Polycrystalline silicon pieces such as nuggets 513 and shards 514 may sit in the troughs 520 of the grooves 512. Polycrystalline silicon pieces such as flakes 515 may sit on top of the crests 519 of the grooves 512. The outlet end 518 of the second deck 510 is angled such that the crests 519 of the grooves 512 extend out further over the gap 516 than the troughs 520 of the grooves 512. As the second deck 510 vibrates, the nugget 513 will fall through the gap 516 while the shard 514 and the flake 515 will fall off the outlet end 518, pass over the gap 516, and be conveyed to the third deck 517. Without wishing to be bound by theory, it is thought that the angle of the outlet end 518 of the second deck 510 minimizes blinding. The decks can be fabricated to be thin at their outlet ends to further minimize blinding.

The step deck classifier 500 will separate the polycrystalline pieces 513, 514, 515 into controlled particle size distributions based on the sizes of the gaps 507, 516, 518, 520, 522, and 524 between the decks 531, 510, 517, 519, 521, 523, and 525. The gaps 507, 516, 518, 520, 522, and 524 increase in size with the direction of conveyance. Smaller polycrystalline silicon pieces fall through the smaller gaps 507, 516, 518 and are collected in the collection container 509 for small size polycrystalline silicon pieces. Larger polycrystalline silicon pieces fall through the larger gaps 520, 522, 524 and are collected in the collection container 526 for larger size polycrystalline silicon pieces. Oversize polycrystalline silicon pieces are collected at the end of the step deck classifier 500 in the collection container 527 for oversize polycrystalline silicon pieces. The oversize polycrystalline silicon pieces can be recycled to the comminuting apparatus. One skilled in the art would recognize that polycrystalline silicon pieces having differing controlled particle size distribution may be withdrawn from the various decks of the step deck classifier through the gaps between the decks by varying the size of gaps, the number of collection containers, and the number and location of conveyors for moving polycrystalline silicon pieces to collection containers.

Weigh scales 528 can be integrated into the controls of the vibratory feeder 501 to fill collection containers 509, 526, 527 such as bags directly or shut off motion to change collection containers when a certain fill weight is reached.

One skilled in the art would recognize that the number of decks; the widths, depths, and shapes of grooves in each deck; the sizes of gaps between decks; and number of collection containers may vary to adjust the size distributions collected. Grooves may have different widths, depths, and shapes. Grooves may be, for example, triangular, square trapezoidal, or rounded.

As with the apparatus used to comminute the polycrystalline silicon, the parts of the apparatus used for sorting that contact polycrystalline silicon pieces are constructed of materials that will not contaminate silicon, such as the materials of construction described above for the jaw crusher 400.

Furthermore, one skilled in the art would recognize that the step deck classifier described above can be used to sort materials other than flowable chips, such as polycrystalline silicon pieces of larger sizes (e.g., larger than 45 mm), by varying the size of the decks; the widths, depths, and shapes of grooves in each deck; the sizes of gaps between decks; and size of collection containers.

Optional Removal of Contaminants

The polycrystalline silicon pieces having a controlled particle size distribution prepared above optionally can be exposed to a magnetic field to remove contaminants. For example, the polycrystalline silicon pieces can be passed through a chamber containing a magnet to remove contaminants, or a magnet may be passed over the polycrystalline silicon pieces. The magnet may be a rare earth magnet or an electromagnet, or combinations thereof. The magnet may directly contact the polycrystalline silicon pieces or be in the near vicinity of the polycrystalline silicon pieces. The magnets remove much of the fine particulate having an appropriate susceptibility to the magnetic field. These particulates include ferromagnetic impurities such as iron and cobalt and paramagnetic impurities such as tungsten carbide, and other ferromagnetic impurities and paramagnetic impurities used in manufacture of materials of construction for the apparatus used to comminute and sort the silicon.

Alternatively, contaminants may be removed by processes disclosed in U.S. Pat. Nos. 3,905,556; 4,125,191; 4,157,953; 4,250,025; 4,345,995; 4,525,336; 5,297,744; and 5,830,282. Contaminants may be removed using chemical methods, such as those disclosed in EP 0 215 121 B1, in addition to, or instead of the methods involving magnetic fields.

Depending on the purity of the polycrystalline silicon rods used as the starting material and methods used to comminute and sort the silicon, the product at this step may have purity sufficient for use in preparing solar cell grade monocrystalline silicon wafers or electronic grade monocrystalline silicon wafers. However, if purity is insufficient for electronic grade applications, or both of these applications, the silicon may be surface cleaned to further remove impurities.

Optional Surface Cleaning

The polycrystalline silicon pieces can be surface cleaned by methods known in the art. Surface cleaning may be carried out in addition to, or instead of, the removal of contaminants method described above. For example, the broken rods can be cleaned by the process disclosed in U.S. Pat. No. 5,851,303 which comprises sequentially contacting the broken rods with gaseous hydrogen fluoride and then with an aqueous solution comprising at least one half percent hydrogen peroxide, and thereafter drying the broken rods. Alternatively, the broken rods can be cleaned by the process disclosed in JP Hei-05-4811. Alternatively, the broken rods can be surface cleaned by anisotropic etching as described in Canadian Patent No. 954425 or U.S. Pat. No. 4,971,654. Other suitable surface cleaning methods include those disclosed by U.S. Pat. Nos. 4,588,571 and 6,004,402.

The resulting flowable chips can be packaged by any convenient means, for example, manually or automatically placing the flowable chips in polyethylene bags.

Methods of Using Flowable Chips

The flowable chips described above can be used for solar cell grade applications or for electronic grade applications, depending on particle size distribution and purity. Specific applications for the flowable chips include initial charge applications such as initial charge maximization and initial charge top up, and recharge applications such as crucible recharge in a CZ process, as well as recharge maximization and recharge top up.

The flowable chips may be used in solar cell casting processes such as those described in U.S. Pat. Nos. 4,176, 166; 4,312,700; 4,382,838; 4,572,812; 5,254,300; 5,431, 869; 5,492,079; and 5,510,095; CN 1176319; DE 4441911; EP 0 869 102; EP 0095757; JP 10190025; JP 11116386; JP 58026019; JP 58099115; JP 62108515; and JP 9301709 in addition to, or instead of, the silicon described therein. Casting may comprise pouring molten silicon into a heated mold or melting polycrystalline silicon in a crucible and allowing the silicon to slowly cool and solidify.

For example, a suitable batch casting process comprises:
1) introducing a semiconductive material into a casting mold comprising walls defining a desired cross sectional-shape,
2) melting the semiconductive material,
3) solidifying the semiconductive material after step 2) to produce a cast ingot having the desired cross sectional-shape. Step 2) may be carried out before, during, or after step 1). The cast ingot may be removed from the casting mold after step 3), and thereafter the process may be repeated. The flowable chips described above may be used to charge the mold in step 1).

Alternatively, a continuous casting process can be used. A continuous casting process can comprise:
1) melting continuously supplied semiconductive material in a bottomless vessel placed in an induction coil,
optionally 2) blowing a hot plasma gas on the surface of the melt for purification, and
3) continuously discharging solidified silicon downward from said bottomless vessel. At least an axial part of the bottomless vessel is divided into a plurality of electrically conductive pieces spaced circumferentially. The semiconductive material may comprise the flowable chips described above.

Alternatively, an apparatus for use in a suitable continuous casting process comprises a plurality of electrically conductive members arranged in a side-to side manner so as to define a container-like area having an open top and an open bottom. The apparatus further comprises a means for inducing high frequency AC electrical currents in each of the conductive members. A retractable support member is provided through the open bottom of the container-like area. The support member acts to support semiconductive material in the container-like area.

A suitable continuous casting process comprises:
1) introducing a semiconductive material into the container-like area of the apparatus described above,
2) melting the semiconductive material,
3) energizing the means for inducing electrical currents thereby inducing first electrical currents in each of the conductive members,
4) using the first electrical currents to induce a second electrical current in the semiconductive material, where said second electrical current flows in a direction substantially opposite to the common direction of flow of said first electrical current; and
5) employing the first electrical currents and the second electrical current so that the semiconductive material is repelled away from and is prevented from contacting the conductive members during the casting process.

The process may further comprise: 6) retracting the support member away from the container-like area in such a manner that molten semiconductive material that is supported by the support member will solidify into a cast ingot as said molten semiconductive material is retracted away from said conductive members, and
7) supplying additional amounts of semiconductive material into the top of the container-like area. Steps 1)-7) may be repeated. The semiconductive material used in steps 1) or step 7), or both, may comprise the flowable chips described above.

The flowable chips may be used in shaped growth processes, such as an Edge-defined, Film-fed, Growth (EFG) process for producing silicon ribbon, such as the EFG processes described by H. E. LaBelle, Jr., in "EFG The Invention and Application to Sapphire Growth," *Journal of Crystal Growth*, vol. 50, 1980, pp. 8-17 and K. Koliwad, et al., "Proceedings of the Flat-plate Solar Array Project Research Forum on the High-speed Growth and Characterization of Crystals for Solar Cells," Katherine A. Dumas, Proceedings Editor, Jet Propulsion Laboratory, California Institute of Technology, Pasadena, Calif., for U.S. DOE, Apr. 15, 1984, pp. 22-24. A suitable EFG process can comprise withdrawing a silicon ribbon from a meniscus of molten silicon defined by the edge of a die. The dimensions of the ribbon are controlled by the meniscus. The ribbon production rate and system heat balance should be carefully controlled.

The flowable chips may be used in an induction plasma process, such as those disclosed in JP 10182124 and *Crystal Growth*, ed. Brian R. Pamplin, Ch. 9, "Creation, Measurement and Control of Crystal Growth Environment," Pergamon Press, Ltd., Oxford, 1975, pp. 343-344. In an example of a plasma induction process, a high frequency plasma torch, e.g., over 4 megaHertz (MHz), is used to melt silicon particles. The torch is formed by ionizing an inert gas such as argon by passing the gas through a high frequency electric field, which is applied between a cathode and anode. Once the argon stream is ionized to a high temperature plasma, silicon in powder form can be co-fed from a hopper into the plasma jet. The silicon will melt within the jet zone, and the molten silicon can be directed toward a water-cooled crucible or onto a growing crystalline silicon body. Flowable silicon chips in the appropriate size range for the plasma torch cavity can be used as the source of silicon for such a process.

The flowable chips may be used in electron beam melting processes, such as those disclosed in U.S. Pat. No. 5,454,424 and JP 62260710. An example electron beam melting process comprises melting polycrystalline silicon by scanning the same with an electron beam, and casting the resulting molten silicon according to any of the casting methods described herein. The polycrystalline silicon can comprise flowable chips.

The flowable chips may also be used in a Heat Exchanger Method (HEM). An HEM furnace can comprise a chamber containing a crucible surrounded by a heating element with a helium heat exchanger connected to the bottom of the crucible. Polycrystalline silicon is placed on top of a seed crystal to fill the crucible. The chamber is evacuated and the heating element is heated to melt the silicon. The seed crystal is prevented from melting by the flow of helium gas through the heat exchanger. The gas flow is gradually increased, lowering the temperature of the heat exchanger and causing silicon to gradually solidify and a crystal to grow outward from the seed crystal. The temperature of the molten silicon is controlled by the heating element; however, the temperature of the solid crystal is independently controlled by the heat exchanger. Dual control of both heating and cooling allows control of the position and movement of the solid-liquid interface of the crystal formation process. HEM is described in "HEM Silicon", Crystal Systems, The National Renewable Energy Laboratory, Golden, Colo.; and in Frederick Schmid and Chandra P. Khattak, "Cutting Silicon Wafer Costs for Photovoltaics," *Optical Spectra*, May 1981.

The flowable chips may also be used in string ribbon processes, such as that disclosed in U.S. Pat. No. 4,689,109. An example of a string ribbon process may comprise:

1) pulling two strings and a seed crystal vertically through a shallow silicon melt, and 2) wetting the strings and the seed crystal with molten silicon and filling the space between the strings, and 3) cooling the product of step 2) to form a silicon ribbon. The string ribbon process is continuous, and the melt can be initially charged and recharged using flowable chips.

The flowable chips may also be used in processes for casting silicon on a substrate, such as the processes disclosed in U.S. Pat. Nos. 4,095,329; 4,323,419; 4,447,289; 4,519,764; 4,561,486; 5,161,717; and 5,178,840; DE 3 210 492; EP 0 079 567; and JP 6168898. An example process comprises:

1) melting polycrystalline silicon to provide a pool of molten silicon in a crucible, 2) applying the molten silicon from the crucible onto a substrate, thereby forming a silicon wafer. The substrate can be moved past the molten silicon, for example, the substrate can be a rotating wafer chuck or other moving substrate. Alternatively, the substrate may be stationary and the molten silicon may be dispensed thereon. Plowable chips can be used to charge or recharge the crucible, or both.

The flowable chips may also be used in sintering processes such as those disclosed in U.S. Pat. Nos. 5,006,317 and 5,499,598. An example of a sintering process comprises:

1) filling a vessel with polycrystalline silicon pieces, 2) locally heating the vessel in a local heating region to melt a portion of the polycrystalline silicon pieces to form a sintering portion and a molten portion, and 3) moving the local heating region in the direction of the longitudinal axis of the vessel to alternately cause solidification the molten portion, melting of the sintering portion, and formation of a new sintering portion; thereby forming a silicon ingot inside the vessel.

The flowable chips may be used in various crystal pulling processes, such as those disclosed in *Crystal Growth*, ed. Brian R. Pamplin, Ch. 13, "Crystal Pulling," Pergamon Press, Ltd., Oxford, 1975, pp. 497-555. These include CZ processes using a crucible and crucible free processes, such as a pedestal, cold hearth, and cold crucible processes. Other cold crucible processes are disclosed by T. F. Ciszek "Some Applications of Cold Crucible Technology for Silicon Photovoltaic Material Preparation," *Journal of the Electrochemical Society*, vol. 132, No. 4, April 1985.

This invention further relates to a method for recharging a crucible used in a CZ process. The method comprises pulling at least one ingot from the crucible and adding flowable chips to the crucible to recharge the crucible.

FIG. 1 shows an example of a CZ process apparatus 100 in which this invention can be used. The apparatus 100 comprises a growth chamber 101 positioned under a pull chamber 102 and isolatable therefrom by a vacuum valve 103. The growth chamber 101 houses a crucible 104 mounted on a shaft 105. The shaft 105 is rotatably connected to a motor 106 for rotating the shaft 105 and crucible 104. The crucible 104 is surrounded by heaters 107 creating a hot zone 114 around the crucible 104. The crucible 104 contains molten silicon 108. An ingot 109 is pulled from the crucible 104 by dipping a seed 110 into the molten silicon 108 and pulling the seed 110 and ingot 109 upward. The seed 110 and ingot 109 are rotated in a direction opposite the crucible 104. The seed 110 is attached to a cable seed lift 111. The cable seed lift 111 is pulled upward by a pulling mechanism 112. A crystal weight readout 113 may be attached to the pulling mechanism 112.

The ingot is removed from the CZ process apparatus without admitting air in the growth chamber. The flowable chips can be added during or after pulling the ingot. The flowable chips can be added in a continuous or batch mode.

The flowable chips are added to the crucible while the growth chamber is under vacuum or under an inert atmosphere, or both.

The flowable chips are added to the crucible while it is hot. Without wishing to be bound by theory, it is thought that if the crucible is cooled to a temperature that is too low, the crucible can break.

The flowable chips are added to the crucible in a manner that does not contaminate the silicon heel.

The flowable chips can be added to the crucible in a batch or continuous mode. The flowable chips can be added to the crucible containing molten silicon or a silicon heel that is at least partially solidified. The flowable chips can be added using various feeder systems.

Figure 2:
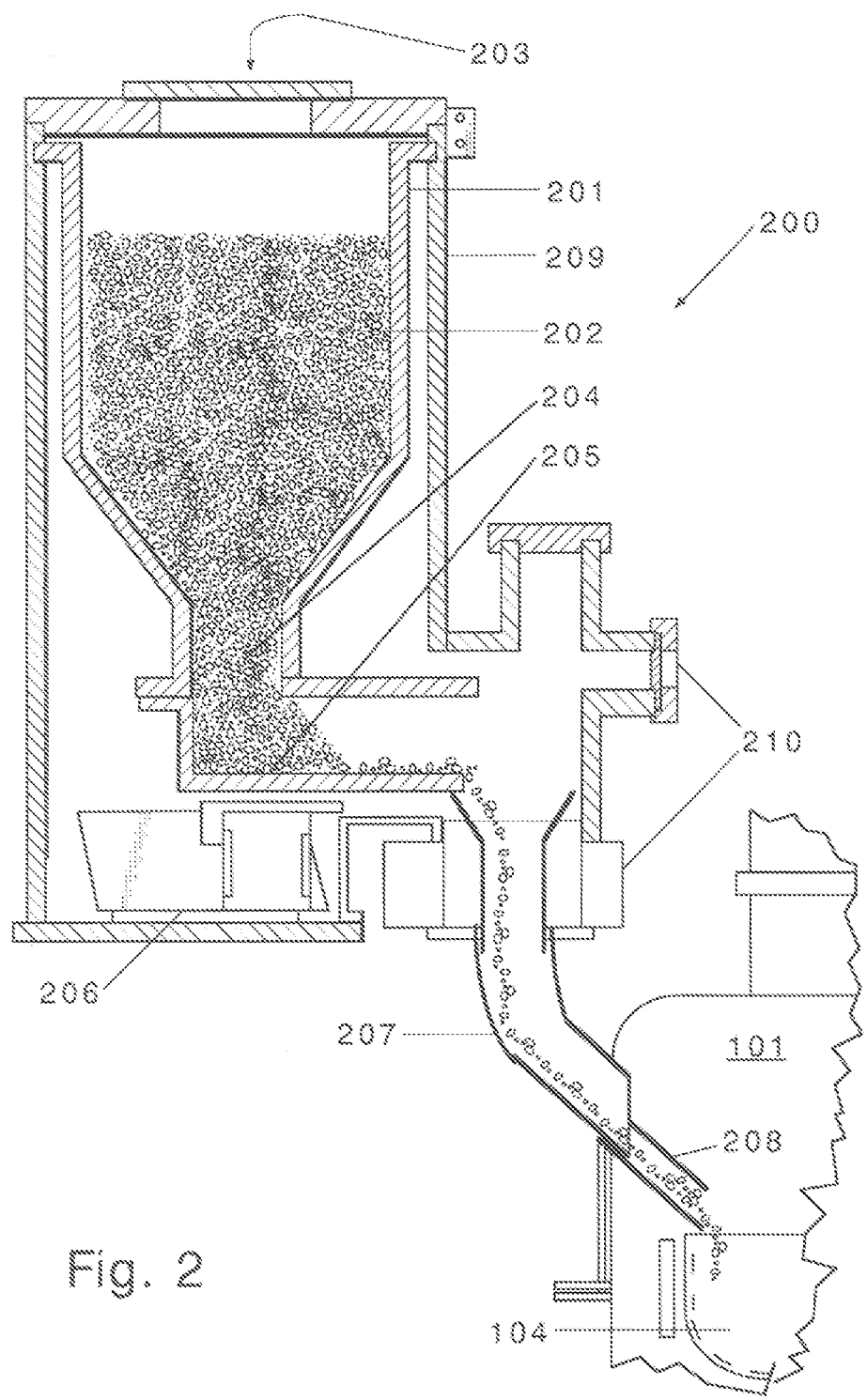
FIG. 2 is a schematic representation of a vibration feeder system for recharging a crucible used in a CZ process.

FIG. 2 is an example of a vibration feeder system 200 for recharging a crucible 104 used in a CZ process, such as that shown in FIG. 1. The vibration feeder system 200 comprises a hopper 201 containing flowable chips 202. The hopper 201 has an access port 203 through which flowable chips 202 can be added and an outlet 204 through which the flowable chips 202 exit to a feed tray 205. The feed tray 205 is mounted to a vibratory feeder 206 for vibrating the feed tray 205. The flowable chips 202 travel from the outlet 204 along the feed tray 205 to a feed tube 207 that runs from the end of the feed tray 205 into the growth chamber 101 of a CZ process apparatus. A lance 208 attached to the end of the feed tube 207 runs from the end of the feed tube 207 into the crucible 104. The access port 203, hopper 201, feed tray 205, and vibratory feeder 206, and at least the inlet of the feed tube 207 are mounted within a housing 209 rated for maintaining vacuum. A charge isolation lock 210 is mounted to the end of the feed tray 205 and the inlet of the feed tube 207 for isolating the housing 209 from the growth chamber 101 during pulling an ingot (not shown) from the crucible 104.

The flowable chips can be added to the crucible using a vibration feeder system in a method comprising:
  i) pulling vacuum on, or inerting, or both, a hopper containing the flowable chips,
  ii) feeding the flowable chips from the hopper to a feed apparatus,
  iii) vibrating all or a portion of the vibration feeder system, thereby moving the flowable chips through the feed apparatus and into the crucible.

Inerting the hopper can be carried out by pulling vacuum on the hopper and purging the hopper with an inert gas such as semiconductor grade argon, helium, or nitrogen at least one time.

The feed apparatus comprises a feed tube, optionally a feed tray from the hopper to the feed tube, and optionally a lance from the feed tube into the crucible. The hopper, feed tray, feed tube, lance, or a combination thereof, can be vibrated to move the flowable chips.

Step iii) can be carried out by vibration of all or a portion of the vibration feeder system at the resonance frequency of the flowable chips.

The flowable chips can be added to the crucible in a batch mode. The flowable chips can be added to the crucible containing a heel that is at least partially solidified. The flowable chips can be added using a canister feeder system (see for example, U.S. Pat. No. 5,488,924 and Daud, T. and Kachare, A., *Advanced Czochralski Silicon Growth Technology for Photovoltaic Modules*, DOE/JPL-1012-70, Distribution Category UC-63b, 5101-2-7 Flat-Plate Solar Array Project, JPL Publication 82-35, Sep. 15, 1982).

Figure 3:
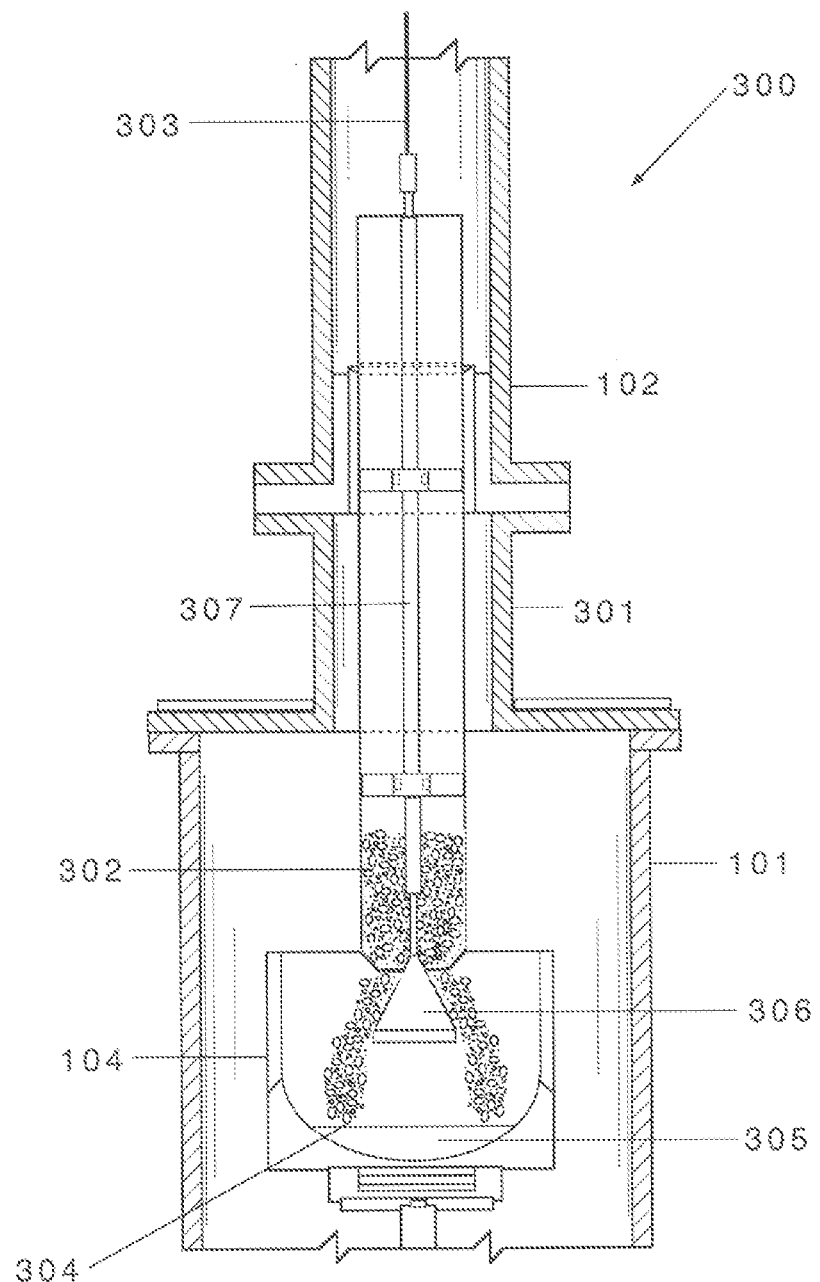
FIG. 3 is a schematic representation of a canister feeder system for recharging a crucible used in a CZ process.

FIG. 3 is an example of a canister feeder system 300 for recharging a crucible 104 used in a CZ process, such as that shown in FIG. 1. The canister feeder system 300 comprises a canister or hopper 301 filled with flowable chips 302. The canister 301 is located in the pull chamber 102 of the CZ process. The pull chamber 102 is closed and evacuated. The canister 301 is mounted to a cable 303. The cable 303 lowers the canister 301 near to the crucible 104; to a level above the at least partially solidified surface 304 of the heel 305 in the crucible 104. The canister 301 has a cone 306 mounted to the outlet of the canister 301. A mechanism 307 moves the cone 306 downward to a level closer but still above the at least partially solidified surface 304 of the heel 305 in the crucible 104. This allows the flowable chips 302 to exit the canister 301 and drop onto the at least partially solidified surface 304 of the heel 305 in the crucible 104.

The flowable chips can be added to the crucible using a canister feeder system in a method comprising:
  optionally a) at least partially solidifying a heel in a crucible,
  b) filling a canister with flowable chips,
  c) pulling vacuum on the canister,
  d) moving the canister to a level above the heel,
  e) opening the canister to allow flowable chips to exit the canister and enter the crucible, and
  f) repeating steps b, c, d, and e until the crucible is filled to a desired level.

The disclosures of methods of using polycrystalline silicon in U.S. Pat. Nos. 3,998,686; 4,002,274; 4,095,329; 4,176,166; 4,312,700; 4,323,419; 4,382,838; 4,394,352; 4,447,289; 4,519,764; 4,557,795; 4,561,486; 4,572,812; 4,661,324; 4,689,109; 4,968,380; 5,006,317; 5,080,873; 5,098,229; 5,161,717; 5,178,840; 5,229,082; 5,242,667; 5,254,300; 5,431,869; 5,454,424; 5,462,010; 5,488,924; 5,499,598; 5,510,095; 5,492,079; 5,690,733; 5,762,491; 5,868,835; 5,902,395; and 6,217,649 are hereby incorporated by reference. One skilled in the art would recognize that flowable chips can be used in addition to, or instead of, the silicon starting materials and recharge materials described therein as well as in any other known method for processing polycrystalline silicon.

Feeder Systems

The flowable chips can also be used instead of granules in feeder systems designed to feed granules. The flowable chips can be used in feeder systems comprising volumetric feeder systems, canister feeder systems, weigh-belt feeder systems, vibration feeder systems, chip thruster feeder systems, pneumatic transport feeder systems, stagnation flow delivery lance feeder systems, rotating disk feeder systems, or auger feeder systems.

Examples of volumetric feeder systems are disclosed in Fickett, B. and Mihalik, G., 'Economic feeder for recharging and "topping off"', *Journal of Crystal Growth*, Siemens Solar Industries, vol. 211, 2000, pp. 372-377. U.S. Pat. Nos. 3,998,686; 5,080,873; and 5,762,491; and JP 62-260791. Examples of canister feeder systems are disclosed in U.S. Pat. Nos. 4,394,352; 4,557,795; 5,229,082; and 5,488,924. Examples of weigh-belt feeder systems are disclosed in U.S. Pat. No. 6,217,649. Examples of vibration feeder systems are disclosed in U.S. Pat. No. 5,462,010 and JP 02-617197 B2. Examples of chip thruster feeder systems are disclosed in U.S. Pat. No. 4,661,324. Examples of pneumatic transport feeder systems are disclosed in U.S. Pat. Nos. 4,968,380 and 5,098,229. Examples of stagnation flow delivery lance feeder systems are disclosed in U.S. Pat. Nos. 5,690,733; 5,868,835; and 5,902,395. Examples of rotating disk feeder systems are disclosed in U.S. Pat. Nos. 4,002,274 and 5,242,667. Examples of auger feeder systems are disclosed in Daud, T. and Kachare, A., *Advanced Czochralski Silicon Growth Technology for Photovoltaic Modules*, DOE/JPL-1012-70, Distribution Category UC-63b, 5101-2-7 Flat-Plate Solar Array Project, JPL Publication 82-35, Sep. 15, 1982. One skilled in the art would recognize that the flowable chips disclosed herein can be used in any other known and suitably sized feeder for processing polycrystalline silicon

EXAMPLES

These examples are intended to illustrate the invention to one of ordinary skill in the art and should not be interpreted as limiting the scope of the invention.

Example 1

WC, Co, GC-712 (General Carbide Corp. powder containing 12% Co and 88% WC and having particle size of 0.6 micrometers), and sintered WC/Co powders are spread on plastic. Initial weight of the powder is recorded. An Eriez® rare earth plate magnet is passed over each powder at a distance of less than 2 millimeters. Final weight of the powder is recorded. The results are in Table 1.

TABLE 1

| Powder | Initial Weight (g) | Final Weight (g) | Comments |
|---|---|---|---|
| WC, 6 micrometer particle size | 1.95 | 1.94 | Some powder is observed on the face of the magnet. Impurities in the WC may be the powder observed on the magnet face. |
| Co | 0.83 | 0.00 | All cobalt was attracted to the magnet except for a fine film that clung to the plastic. |
| GC-712 | 10.3 | 0.00 | All powder was captured by the magnet. |
| Sintered WC/Co | 1.14 | 0.00 | All powder was captured by the magnet. |

Example 1 shows that impurities may be removed from polycrystalline silicon pieces using a magnet. In particular, WC/Co impurities introduced by the jaw crusher in FIG. 4 may be removed using the method of Example 1.

Example 2

Four samples of flowable chips are prepared by the following method. Polycrystalline silicon U-rod shaped material is obtained from a cold wall, Siemens-type bell jar reactor. Following removal of the carbon socket end, silicon in U-rod form is broken into 10-15 centimeter (cm) pieces using a low contamination impact tool on a polyethylene table. The resulting silicon chunks are fed to the jaw crusher 400 shown in FIG. 4. The width of the discharge slot is restricted to 15 mm at the distance of closest approach. As the polycrystalline silicon pieces pass through the discharge slot 418, they pass through an air-entrained dust collection zone, which acts to remove dust from the polycrystalline silicon pieces. The resulting polycrystalline silicon pieces are collected into a polyethylene-lined bin.

The collected polycrystalline silicon pieces are then crushed again using the same equipment. Following the crushing step, the collected polycrystalline silicon pieces are transferred to a UHMWPE hopper, which acts to regulate the flow rate of the silicon pieces, and are fed onto the step deck classifier 500 shown in FIGS. 5-8. Both the hopper 502 and step deck classifier 500 are mounted to a vibratory table 501, the action of which causes the movement of the polycrystalline silicon pieces. The decks are adjusted to maintain the nominal product size range between 1 mm and 12 mm Polycrystalline silicon pieces greater than 12 mm in length are rejected from the product and sent back to the crushing operation for an additional crushing pass in which the crushed material is blended with polycrystalline silicon pieces that had been exposed to one crushing pass. This procedure is repeated several times until a quantity of 300 kilograms (kg) of polycrystalline silicon pieces is obtained. During the course of processing, four samples of the polycrystalline silicon pieces are collected in acid-cleaned PTFA containers. These samples are submitted for surface metals analysis according to the method of U.S. Pat. No. 5,851,303. The resulting purity of the silicon is reported below in Table 2. Controlled particle size distribution of each of the samples of the polycrystalline silicon pieces is 1 to 12 mm.

TABLE 2

| | Purity in ppba | | | | | |
|---|---|---|---|---|---|---|
| | Fe | Ni | Cu | Cr | Na | Zn |
| 1 | 6.8 | non-detectable | 0.142 | 0.016 | 0.402 | 0.550 |
| 2 | 9.5 | 0.094 | 0.027 | 0.056 | 0.827 | 0.504 |
| 3 | 17.5 | 0.069 | 0.016 | 0.004 | 0.874 | 0.393 |
| 4 | 9.6 | 0.038 | 0.022 | 0.012 | 0.378 | 0.384 |

Example 3

Polycrystalline silicon U-rods are obtained from a cold wall, Siemens-type bell jar reactor. Following removal of the carbon socket end, silicon in U-rod form is broken into 4-inch pieces using a low contamination impact tool on a polyethylene table. The resulting polycrystalline silicon chunks are fed to the jaw crusher 400 shown in FIG. 4. The width of the discharge slot 418 is restricted to 15 mm at the distance of closest approach. As the polycrystalline silicon pieces pass through the discharge slot 418, they pass through an air-entrained dust collection zone, which acts to remove dust from the polycrystalline silicon pieces. The polycrystalline silicon pieces pass into a polyethylene-lined bin. The collected polycrystalline silicon pieces are crushed again using the same equipment. Following the crushing step, the resulting polycrystalline silicon pieces collected are transferred to a UHMWE hopper, which acts to regulate the flow rate of the polycrystalline silicon pieces to the step deck classifier 500 in FIG. 5. The decks are adjusted to maintain the nominal product size distribution between 1 mm and 12 mm. A quantity of 40 kg of the polycrystalline silicon is processed. Bulk impurities (boron, total donor, carbon, phosphorous, iron, nickel, copper, and chromium) and surface impurities (iron, nickel, copper, chromium, sodium, and zinc) are measured. For surface purity analysis, four samples of the polycrystalline silicon pieces are collected in acid-cleaned PTFA containers.

These samples are analyzed for bulk impurities and surface impurities. The bulk metals values are obtained using acid digestion of a freeze-out tip from an etched, float-zoned core. The core is taken from a polycrystalline silicon rod. The procedure for obtaining the bulk metals values is described in U.S. Pat. No. 4,912,528. The metals concentration is measured from the analyte using atomic absorption.

Carbon is measured from the float-zoned core. A slice is taken from the core. The slices are lapped and polished. Fourier transform infrared spectroscopy is used to measure the concentration of carbon in the silicon.

Phosphorous, boron, aluminum, and arsenic are measured from the float-zoned core using a technique known as dispersive photoluminescence (PL). With this test, a single crystal slice from the float-zoned core is chemically polished. By cooling the slice to the temperature of liquid helium, an argon laser is used to cause a photon emission in the sample. The measured intensity of the emission of recombining electron-hole pairs is used to determine the concentration of these impurities.

Donor is a calculated value, which can be obtained from measuring the resistivity of the silicon core.

Surface impurities are measured by the method in U.S. Pat. No. 5,851,303. The resulting purity of the silicon is reported below in Tables 3 and 4. Controlled particle size distribution of each sample of the polycrystalline silicon pieces is 1 to 12 mm

TABLE 3

| Bulk Impurities | | |
|---|---|---|
| Boron | 0.0032 | ppba |
| Donor | 0.02 | ppba |
| Carbon | 0.024 | ppma |
| Phosphorous | 0.015 | ppba |
| Iron | 0.01 | ppba |
| Nickel | 0.01 | ppba |
| Copper | 0.01 | ppba |
| Chromium | 0.01 | ppba |

TABLE 4

| Surface Impurities in ppba | | | | | | |
|---|---|---|---|---|---|---|
| Trial | Fe | Ni | Cu | Cr | Na | Zn |
| 1 | 17.1 | 0.20 | 0.10 | 0.01 | 0.37 | 0.86 |
| 2 | 21.5 | 0.17 | 0.15 | 0 | 0.82 | 0.51 |
| 3 | 11.5 | 0.58 | 0.11 | 0.03 | 0.14 | 1.39 |
| 4 | 14.3 | 0.20 | 0.10 | 0.07 | 0 | 0.38 |
| Mean | 16.1 | 0.29 | 0.11 | 0.03 | 0.33 | 0.79 |

We claim:

1. A solar cell casting process comprising:
   1) melting silicon comprising flowable chips to form molten silicon,
   where said flowable chips comprising polycrystalline silicon pieces are prepared by a chemical vapor deposition process and have a controlled particle size distribution, where at least 75% of the particles have a particle size of 0.2 to 45 mm, generally nonspherical morphology, a level of bulk impurities not exceeding 0.03 ppma, and a level of surface impurities not exceeding 15 ppba,
   2) pouring the molten silicon into a heated mold, and
   3) allowing the molten silicon to slowly cool and solidify.

2. The process of claim 1 where the melting of the silicon comprising flowable chips is in a crucible.

3. A method comprising:
   a) pulling a silicon ingot from a crucible in a Czochralski-type process;
   b) adding flowable chips to molten silicon in the crucible, where flowable chips comprise polycrystalline silicon pieces prepared by a chemical vapor deposition process and have a controlled particle size distribution, generally nonspherical morphology, low levels of bulk impurities, and low levels of surface impurities; and
   c) optionally adding a dopant to the crucible.

4. A method comprising:
   1) introducing a semiconductive material comprising flowable chips into a casting mold comprising walls defining a desired cross sectional-shape,
   said flowable chips comprising polycrystalline silicon pieces prepared by a chemical vapor deposition process and having a controlled particle size distribution, where at least 75% of the particles have a particle size of 0.2 to 45 mm, generally nonspherical morphology, a level of bulk impurities not exceeding 0.03 ppma, and a level of surface impurities not exceeding 15 ppba,
   2) melting the semiconductive material, and
   3) solidifying the semiconductive material after step 2) to produce a cast ingot having the desired cross sectional-shape.

* * * * *